United States Patent [19]

Hammond et al.

[11] Patent Number: 4,972,050
[45] Date of Patent: Nov. 20, 1990

[54] WIRE SCRIBED CIRCUIT BOARDS AND METHODS OF THEIR MANUFACTURE

[75] Inventors: Joseph Hammond, Roslyn; John Branigan, Smithtown, both of N.Y.

[73] Assignee: Kollmorgen Corporation, Simsbury, Conn.

[21] Appl. No.: 374,489

[22] Filed: Jun. 30, 1989

[51] Int. Cl.⁵ .......................... H05K 1/00; H05K 3/00
[52] U.S. Cl. ...................................... 174/251; 29/846; 29/850; 174/261
[58] Field of Search .............. 174/68.5, 261, 251; 29/846, 850, 853

[56] References Cited

U.S. PATENT DOCUMENTS

| | | | |
|---|---|---|---|
| 3,019,489 | 2/1962 | Burg | 29/850 X |
| 3,674,914 | 7/1972 | Burr | 174/261 |
| 3,701,838 | 10/1972 | Olney, Jr. | 174/68.5 |
| 4,097,684 | 6/1978 | Burr | 174/262 |
| 4,500,389 | 2/1985 | Lassen | 156/643 |
| 4,533,787 | 8/1985 | Anderegg et al. | 174/68.5 |
| 4,541,882 | 9/1985 | Lassen | 156/150 |
| 4,544,442 | 10/1985 | Lassen | 156/643 |
| 4,602,318 | 7/1986 | Lassen | 174/68.5 X |
| 4,642,321 | 2/1987 | Schoenberg et al. | 524/420 X |
| 4,646,436 | 3/1987 | Crowell et al. | 174/68.5 X |
| 4,679,321 | 7/1987 | Plonski | 174/68.5 X |
| 4,743,710 | 5/1988 | Shieber et al. | 174/68.5 |

Primary Examiner—Morris H. Nimmo
Attorney, Agent, or Firm—Morgan & Finnegan

[57] ABSTRACT

The invention concerns an interconnection board for connecting electronic, electro-optical and/or optical devices and methods of manufacturing such boards. The interconnections are formed by scribing electrially or optically conductive filaments to form a signal conductor layer. The interconnection board comprises a base as a support member, a signal conductor layer laminated to the base and a surface conductor layer laminated to the signal conductor layer. The interlayer connections between the signal conductor layer and the surface conductor layer are formed by segments of the conductive filaments of the signal conductor layer displaced from the signal conductor layer to the vicinity of surface of the interconnection board to form part of or connect with the surface conductive pattern.

20 Claims, 9 Drawing Sheets

WIRE SCRIBED CIRCUIT BOARDS AND METHODS OF THEIR MANUFACTURE

FIELD OF THE INVENTION

This invention relates to wire scribed, discrete wiring boards having inner layer conductors terminated without using plated-through holes, and to methods of manufacturing such discrete wiring boards. More particularly, this invention relates to wire scribed, discrete wiring boards having an improved interlayer connection which improves manufacturability of high density boards and increases the percentage of the surface area available for component mounting and the usable wireways available for conductor routing, and to methods of manufacturing such discrete wiring boards.

BACKGROUND OF THE INVENTION

Printed wiring boards have long been used to interconnect electronic components. As electronic components have increased in complexity, the interconnections have been made by multilayer printed boards.

Multilayer printed boards for high frequency or narrow pulse width signals require transmission line construction for controlled impedance to preserve the signal. Transmission lines in microstrip configuration can be used when all the required signal conductors can be accommodated on one or two signal conductor layers. A typical microstrip configuration has two internal conductor layers, a ground plane and a voltage plane (usually continuous sheets of metal with suitable clearances), and two outer signal conductor layers which are separated from either the ground or the voltage plane by dielectric material of controlled thickness and dielectric constant. A stripline configuration is used when the printed wiring board design requires more high frequency or narrow pulse width signal conductors than can be accommodated in two conductor layers. In the stripline configuration, each signal plane or signal conductor layer is placed equidistant to two parallel ground planes.

VLSI (Very Large Scale Integrated circuits) in surface mounted component packages permits closer placement of the components on a printed circuit board than can be achieved with plated-through hole component mounting. Close placing of the components permits shorter conductors and shorter component leads than plated-through hole component mounting. Short conductors and component leads are essential to maintain the integrity of high frequency and narrow pulse width signals.

In many multilayer printed boards, signal conductors are placed on a grid. A single, signal conductor layer has wireways or potential conductive paths which are parallel and equidistant from one another. A parallel signal conductor layer has wireways in a direction orthogonal to the first layer. Connections between the conductor layers are made using plated-through holes. In order to route a signal conductor from one land or terminal point on one wireway to another land or terminal point on a second wireway, the conductor must be routed through plated-through holes to a layer having orthogonal wireways to change direction or cross parallel conductors. The plated-through holes block the wireways available for other signal conductors. Blocked wireways means less available wire-ways for subsequent conductor routing, more frequent direction changes and longer signal conductor paths. Also, each plated-through hole has a capacitance of approximately 0.5 to 1.2 picofarads, so a series of plated-through holes changes the impedance of the conductor path.

Wire scribing as a method of preparing discrete boards was first taught by Burr in U.S. Pat. Nos. 3,674,914 and 4,097,684. In these patents, Burr taught the use of insulated wires so that wire scribed signal conductors can cross one another in the same layer without changing to another conductor layer. That reduced the number of plated-through holes required, increased the available wireways and shortened the signal conductors compared to multilayer printed boards. U.S. Pat. No. 4,097,684 taught termination of the wire scribed conductors in plated-through holes. Using Burr's wire scribing method the impedance of one insulated wire crossing another was found to be less than 0.03 picofarads, much less than the impedance of plated-through hole, reducing the impedance compared to multilayer printed boards.

Wire scribed interconnection boards made according to Burr use plated-through holes only for component mounting and termination of discrete wire conductors. Such boards are ideally suited for the high density conductor routing for dual-in-line packages (DIPs) and other plated-through hole mounted components.

Lassen in U.S. Pat. Nos. 4,500,389, 4,541,882 and 4,544,442 taught methods of manufacturing high density, wire scribed interconnection boards particularly suited for surface mounted components. The surface conductor layer for mounting components consisted of (a) conductive pattern or lands for connection and attachment to the surface mount components and short conductors connecting the lands to laser drilled plated-through holes. The plated-through holes in turn connect to an internal, wire scribed, signal conductor layer.

The interconnection boards according to Lassen have plated-through holes from the surface conductor layer to the signal layer. To reduce the number of wireways blocked by the plated-through holes, Lassen teaches the use of small laser drilled holes which take up less room than conventional plated-through holes. Up to this time the interconnection boards produced by the Lassen procedures have the highest conductor density available in commercial production, about 50 cm of conductors per square cm of conductor layer (125 in/in$^2$).

SUMMARY OF THE INVENTION

Definitions

"Conductive filament" refers to filaments containing at least one conductive portion, i.e., a portion which can act as a conductor, e.g., an electrical conductor, an optical conductor or the like. The conductive portion of the filaments may or may not have a dielectric coating and/or an energizable adhesive surface for bonding the filaments to the carrier. For example, the filaments might be preinsulated wires, such as copper wire of about 0.4 to 3 mm in diameter.

"Crossover" refers to two or more conductive filaments in the same conductor layer having one set of common x,y coordinates, and where one or more filaments traverse at least one other filament and are displaced in the z-direction by least the diameter of a filament.

"Scribing" refers to writing of conductor paths on an insulating base by feeding a continuous strand of conductive filament onto the surface of the base, simultaneously affixing the filament to the base and cutting the filament at the end of each written line to produce a conductive filament image of a predetermined pattern.

"Wire scribing" refers to scribing with a preformed wire.

"Scribed conductor layer" refers to the total conductive pattern including crossovers scribed on one layer of an insulating support. A scribed conductor layer for conductive filament scribing is composed of at least two orthogonal sets of parallel wireways used for routing conductors on the layer.

"Wireway" refers to a rectangular area on a conductor layer suitable for routing a conductor. The length of the wireway is the overall dimension of the conductor layer, the width of the wireway is the pitch or nominal center-to-center distance of adjacent conductors.

"Blocked wireway" refers to a wireway with an obstruction to a conductor routing such as a hole or a wireway not available for routing due to a previously routed conductor.

"Surface conductor layer" refers to a layer having a conductive pattern on an outer surface of an interconnection board.

"Electronic devices" refers to integrated circuits, diodes, transistors, resistors, capacitors, inductances, switching devices, connectors and the like.

"Electro-optical devices" refers to light-emitting diodes, transistors, integrated circuits and the like which receive or transmit electronic and optical signals.

"Optical devices" refers to optical connectors and the like which receive, transmit or manipulate optical signals.

"Footprint" refers to the land pattern of the surface conductor layer associated with a single surface mount component.

"Fan-out" refers to the group of short conductors on a conductor layer which connect the land pattern of the surface mounted component's footprint and the plated-through holes.

OBJECTS OF THE INVENTION

It is an object of this invention to provide a method of manufacturing an interconnection board with a high density of signal conductors or with high connectivity.

It is an object of the invention to provide a direct interlayer connection from an internal layer to a surface conductor layer without using a plated-through hole.

It is also an object of this invention to minimize the number of blocked wireways in an interconnection board.

It is an object of this invention to reduce the number of plated-through holes required in an interconnection board.

An object of this invention is an interconnection board with controlled impedance of the signal conductor layers, and it is also an object of this invention to provide methods for manufacturing such interconnection boards.

Additional objects of this invention are controlled impedance interconnection boards without clearance holes or a minimum number of clearance holes in the ground or voltage planes.

It is an object of this invention to interconnect optical, electro-optical and electronic devices.

A further object of this invention is a discrete wiring board for surface mounted components.

It is also an object of this invention to provide discrete wiring boards for surface mounted components with controlled impedance signal conductors and low impedance connections between the components and the signal conductors.

An object of this invention is to provide a method of closer packing or higher density mounting of surface mount components by eliminating the plated-through holes and the surface conductor fan-out pattern connecting the plated-through holes to the surface mount component footprint.

An object of this invention is to provide a method of preparing an improved interlayer connection for an interconnection board which improves manufacturability of high density boards.

An object of this invention is to provide a method of preparing an improved signal conductor layer for a wire scribed, discrete wiring board which increases the percentage of usable wireways available for conductor routing.

An object of this invention is to provide a method of preparing a wire scribed, discrete wiring board with improved manufacturing yields by reducing the complexity of the surface conductor layer.

Additional objects and advantages of the invention will be set forth in the description or may be realized by practice of the invention, the objects and advantages being realized and attained by means of the methods, processes, instrumentalities and combinations particularly pointed out in the appended claims.

BRIEF DESCRIPTION OF THE INVENTION

In one aspect, the invention comprises an interconnection board with a scribed inner layer of conductive filaments, where segments of the filaments are displaced and extend from the scribed conductor layer to a surface conductor layer, the segments serving as interlayer connections.

In another aspect, the invention comprises an article for interconnecting electronic, optical and/or electro-optical devices. The article comprises a base, an internal conductor layer disposed within the article, a surface conductor layer, and a plurality of segments of conductive filaments displaced and extending from the internal conductor layer to the surface conductor layer connecting the internal conductor layer to the surface. In this aspect of the invention, the internal conductor layer comprises a plurality of conductive filaments fixed in an adhesive layer in a first predetermined pattern, and the surface conductive layer comprises a plurality of conductors in a second predetermined pattern. The second predetermined pattern preferably corresponds to the terminals of the devices.

The invention also comprises an interconnection board having a scribed signal conductor layer of conductive filaments and a surface conductive pattern comprised of segments of the conductive filaments or filament segments surrounded by contiguous surface conductor features joined to the filament segments.

In yet another aspect, the invention is an article comprising a base having ground and voltage planes thereon, at least one internal conductor layer comprising conductive filaments disposed within the article, and a surface conductor layer connected to the internal conductor layer by segments of conductive filaments displaced and extending from the internal conductor layer to the surface. In this aspect of the invention, the internal conductor layer comprises a plurality of conductive filaments fixed in an adhesive layer in a first predetermined pattern, and the surface conductive layer comprises a plurality of conductors in a second predetermined pattern. The second predetermined pattern preferably comprises the footprint of surface mounted components.

In one aspect, the invention comprises discrete wiring boards with at least one transmission line discrete wire conductor layer and interlayer connections from the discrete wire conductor layer to a surface conductive pattern without plated-through holes.

The invention also comprises methods and processes for construction of such interconnection boards.

DETAILED DESCRIPTION OF THE INVENTION

According to the present invention there is provided an article for interconnecting electronic, electro-optical or optical components and method(s) for its manufacture. The article has a base for structural strength and support. At least one internal signal conductor layer formed by a plurality of conductive filaments adhered to the base is disposed within the article in a first predetermined pattern forming a conductive layer. The filaments are substantially coplanar relative to one another, i.e., all the filaments are in the same plane except at crossovers. At crossovers a filament crossing at least one other filament is displaced from the common plane in the direction of the base by the diameter(s) of the underlying filament(s). At predetermined points corresponding to the lands, terminal points or footprint of the devices to be connected, the wire is displaced from the common plane of the internal conductive layer in the direction away from the base and towards the exterior surface of the article forming interlayer connections from the first predetermined pattern of conductive filaments and the lands.

In one of its most fundamental aspects, the invention relates to the direct termination of wire scribed conductors in the lands of the surface conductive pattern. It comprises precise, predetermined wire scribing in three dimensions, the two dimensions of the signal conductor layer and the third dimension, the interlayer connection to another conductor layer.

The present invention also concerns scribed interconnection boards wherein the interlayer connections are integral with the signal conductors of an internal conductor layer and methods of their manufacture. The integral, interlayer connections are terminated without using plated-through holes, minimizing the number of required holes and blocked wireways. The integral, interlayer connection eliminates the need for plated-through holes to make connections to the signal conductor layers and thereby minimizes the blocked wireways that such plated-through holes cause for conductor routing. The reduction in blocked wireways makes possible higher density conductor routing and shorter conductor paths. It will be obvious to circuit board designers skilled in the art that shorter conductor paths and reduction in through holes simplify the design and improve the performance of circuit board assemblies designed for high frequency or narrow pulse width signals.

Figure 1A:
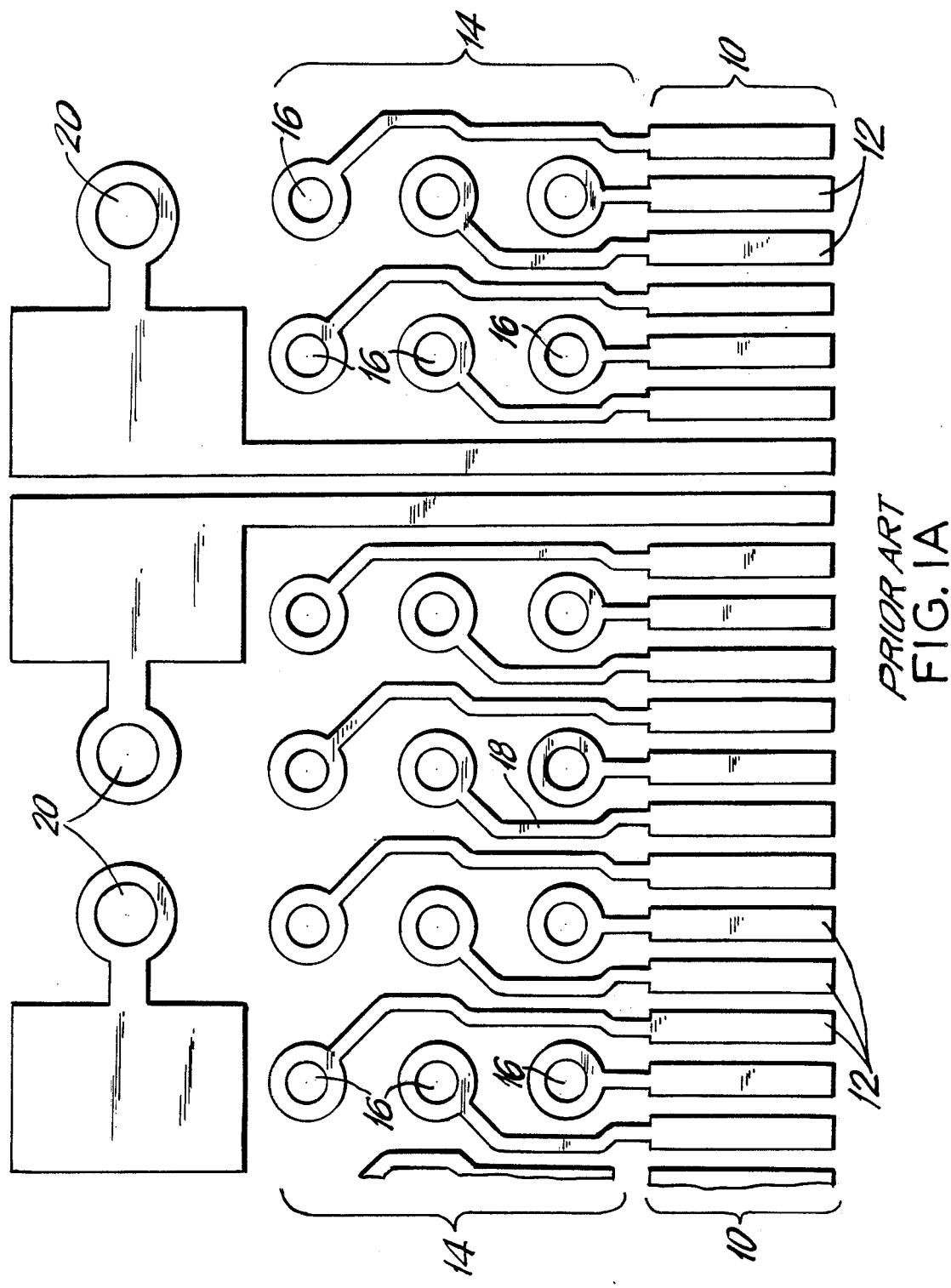
FIG. 1A is a plan view of a portion of a surface conductor layer of a high density wire scribed circuit board prepared according to the teachings of U.S. Pat. Nos. 4,500,389; 4,541,882; and 4,544,442 to Lassen. The surface conductor layer shown in FIG. 1A includes a portion of a conventional footprint of a surface mounted electronic component as well as a fan-out for connections to internal layers.

Referring to FIG. 1A, there is shown a small portion of the surface conductor layer of a prior art, wire scribed, interconnection board. The portion of surface conductor layer includes a small part of a footprint 10 showing twenty-one contacts 12 and the fan-out 14 showing plated-through holes 16 and short conductors 18 connecting to the footprint of one of the surface mounted VLSI components of the interconnection assembly. Although FIG. 1A shows twenty-one contacts, the complete footprint of the VLSI component (not shown) has 284 contacts for connection of the surface mounted component to the interconnection boards. The complete interconnection board (not shown) interconnects four different VLSI components of similar complexity and a number of smaller integrated circuits. The fan-out leads to plated-through holes 16, which connect to the signal conductor layer. Other plated-through holes 20 connect to the ground or voltage layers.

Figure 1B:
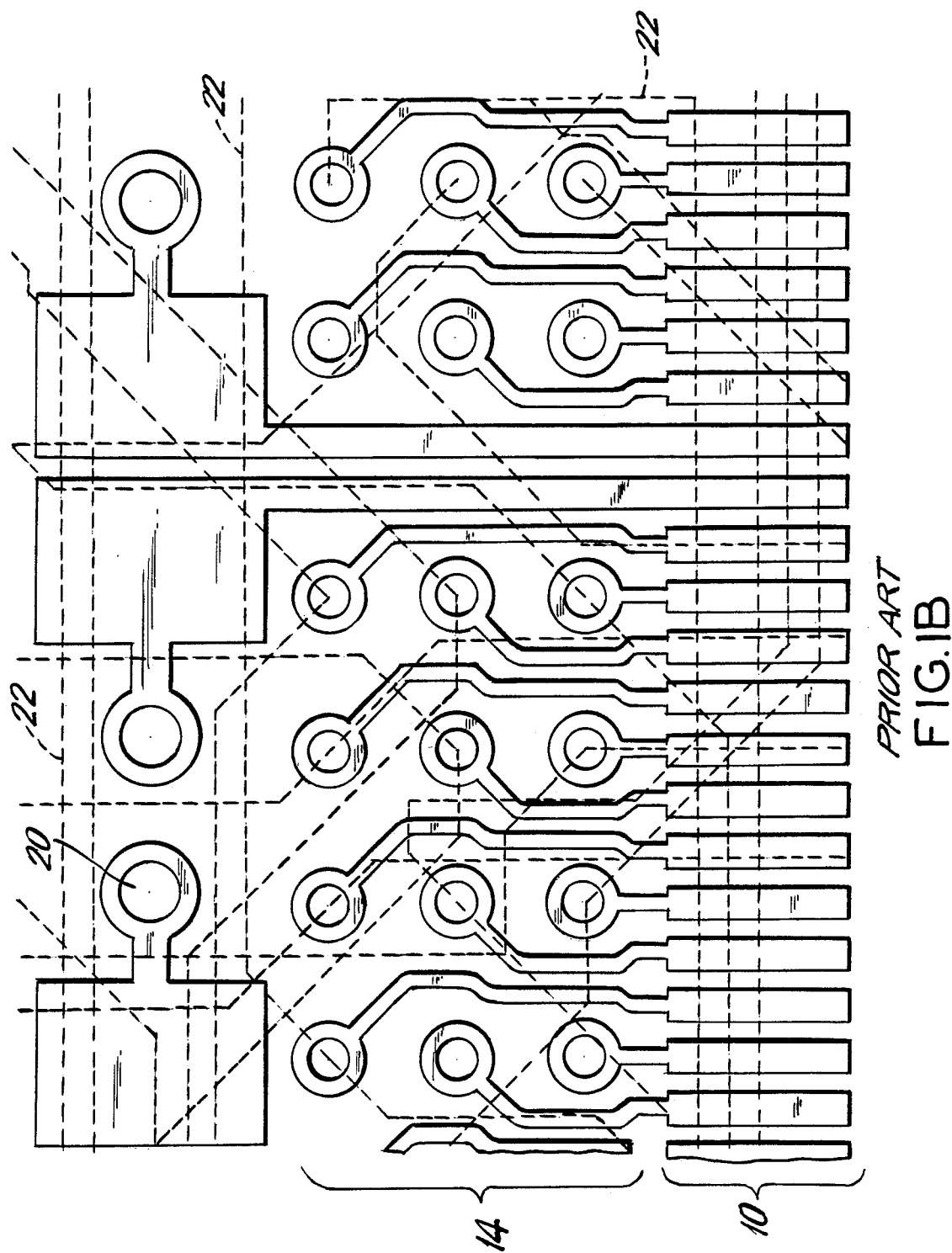
FIG. 1B is a plan view of the same portion of the wire scribed circuit board shown in FIG. 1A further showing both the surface conductor layer and a wire scribed conductor layer buried below the surface conductor layer.

FIG. 1B is a plan view of the same portion of the prior art wire scribed circuit board shown in FIG. 1A showing the wire scribed conductors 22 of the signal conductor layer buried beneath the surface conductor layer. The scribed wires are insulated wires having typically a copper conductor with a diameter of 0.064 mm (0.0025 inch) and an outside diameter of 0.14 mm (0.0054 inch). The conductor wireway is 0.32 mm (0.0125 inch) wide. In a given area of a signal conductor layer, the total length of wireways is 85 cm/cm$^2$ (220 inches/inch$^2$). Because many of the wireways are blocked by plated-through holes, the total length of available wireways in the interconnection board of FIG. 1B is only 50 cm/cm$^2$ (125 inches/inch$^2$).

Figure 2A:
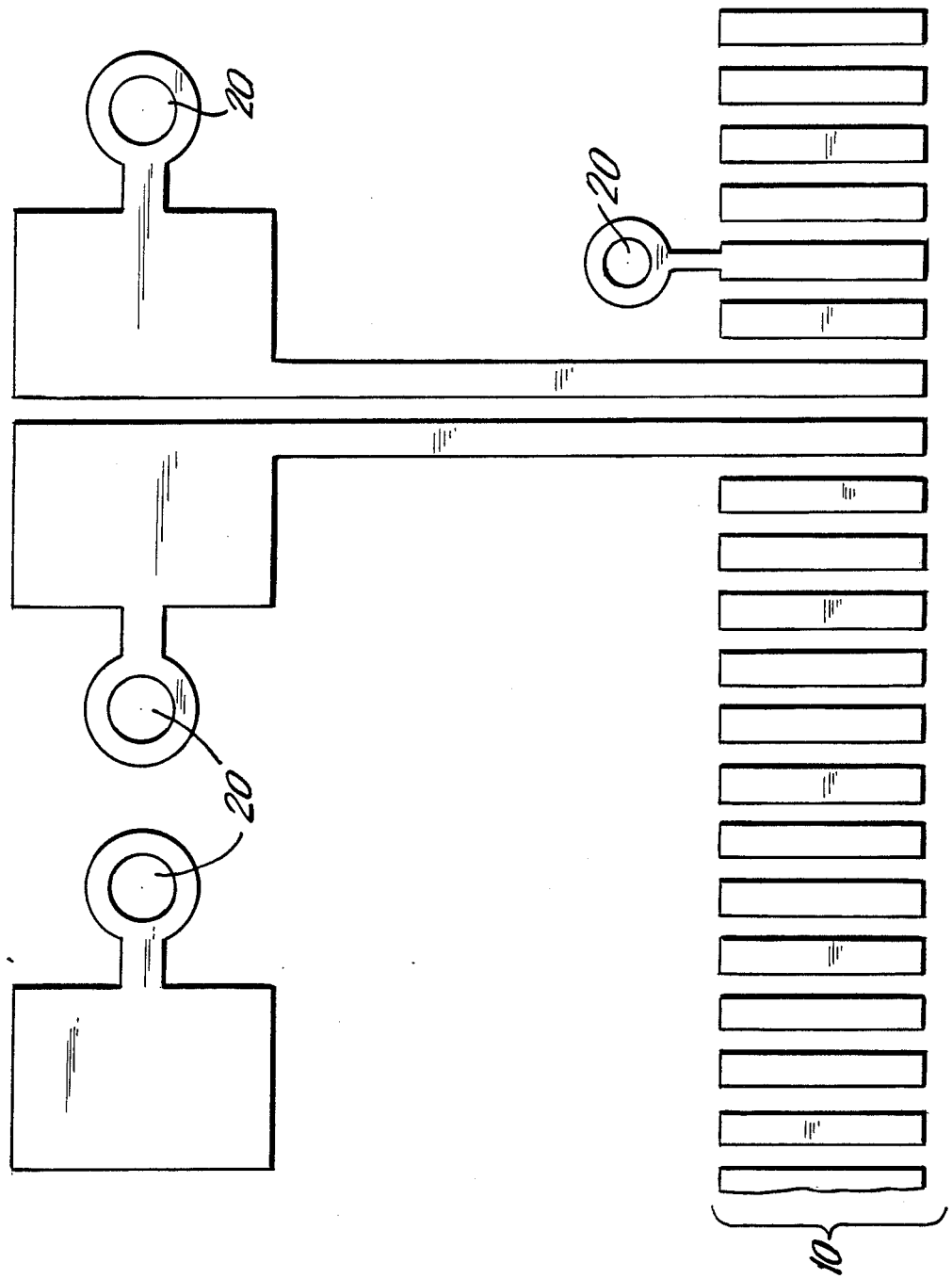
FIG. 2A is a plan view of a portion of a surface conductor layer of a high density wire scribed circuit board prepared according to the teachings of this invention. The surface conductor layer shown in FIG. 2A includes the portion of the same conventional footprint of a surface mounted component shown in FIG. 1A.

FIG. 2A shows a portion of a surface conductor layer of a high density wire scribed circuit board prepared according to the teachings of this invention. The twenty-one contacts 12 of the footprint 10 of the surface mounted component are the same as are shown in FIG. 1A. However the fan-out 14 shown in FIG. 1A is not required in the interconnection boards of this invention, and is not present in FIG. 2A. The seventeen plated-through holes 16 shown in FIG. 1A which connect the fan-out to the signal layer are also not required. In FIG. 2A, only the four plated-through holes 20 are shown which connect to the ground and voltage planes. These correspond to the four plated-through holes 20 in FIG. 1A.

Figure 2B:
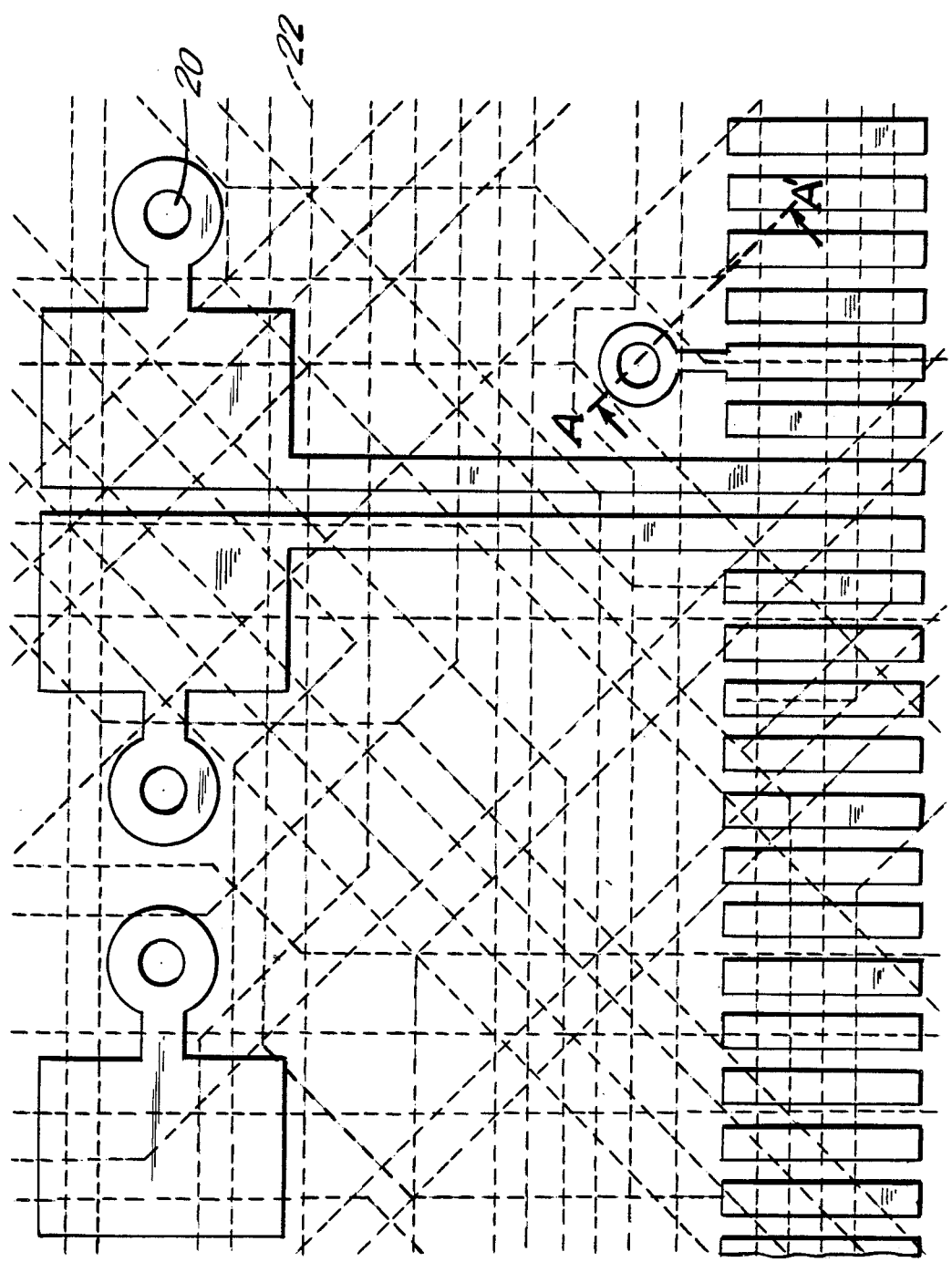
FIG. 2B is a plan view of the same portion of the wire scribed circuit board shown in FIG. 2A further showing both the surface conductor layer and a wire scribed conductor layer buried below the surface conductor layer.

FIG. 2B is a plan view of the portion of the wire scribed circuit board shown in FIG. 2A also showing the wire scribed conductors 22 buried beneath the surface conductor layer. The scribed conductors terminate directly on the footprint lands 12 instead of terminating in plated-through holes as in the prior art FIG. 1B. Due to the elimination of seventeen of the twenty-one plated-through holes shown in FIGS. 1A and 1B, the total length of available wireways in the area of the signal conductor layer is increased to about 85 cm/cm$^2$ (200 inches/inch$^2$) compared to 125 cm/cm$^2$ in FIG. 1B.

Figure 3:
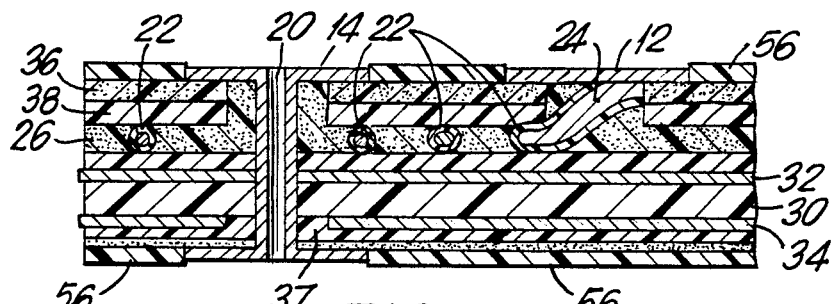
FIG. 3 is a cross-sectional view taken along line A-A' of FIG. 2B showing a portion of the wire scribed circuit board according to this invention.

FIG. 3 is a cross-sectional view taken along line A-A' of FIG. 2B. The interconnection board has a ground and voltage layer comprising insulating base material 30 with ground plane 32 and voltage plane 34. The voltage plane has been provided with a etched clearance hole 37. Similarly the ground plane is provided with clearance holes (not shown) as required. Superimposed on the ground and voltage layer is a signal conductor layer formed by a conductive pattern of conductive filaments 22 scribed into an adhesive 26 on the outer surface of the interconnection board are the surface conductor layers which may comprise a footprint 12 and or other surface conductors 14. A plated-through hole 20 forms the connection between the surface conductors 14 and the ground plane. Other plated-through holes (not shown) form connections between surface conductors and the voltage plane. An interlayer connection 24 between the scribed signal conductor layer 22 and a conductor land 12 of the footprint of a surface mounted component is made by a segment of the filament displaced from the signal conductor layer and extending to the surface conductor layer at a predetermined point.

In one method for the manufacture of an interconnection board according this invention, the ground and voltage layer and the signal conductor layer(s) conveniently may be prepared separately and then joined together After the ground and voltage layer and the signal conductor layer(s) have been joined together as a single, unitary structure, the surface conductor layers may be formed on the exterior surface of the structure.

The steps in a process for preparing the interconnection board of FIG. 3 by such a method are illustrated in FIGS. 3A to 3I.

Figure 3A:
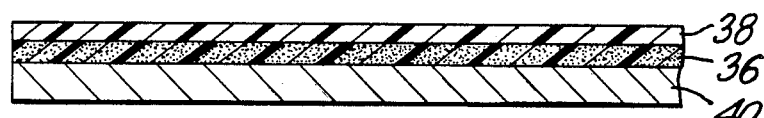
FIGS. 3A through 3I are cross-sectional views illustrating steps in a method of preparing the portion of the wire scribed circuit board shown in FIG. 3.

FIG. 3A illustrates a support for a signal conductor layer. In this method, the signal conductor layer is prepared on a temporary support 40. The temporary support must supply rigidity and dimensional stability to the transmission layer during the scribing process and during the joining of the transmission layer to the ground and voltage layer. After the joining of the signal conductor layer to the ground and voltage layer, the temporary support must be capable of being removed without difficulty. Suitable as temporary supports are thin rigid sheets of metal or plastic that can be removed by etching, solvents, melting or though release agents on, or release properties of, the temporary support. Among suitable, temporary supports are aluminum or copper sheets 0.05 mm to 5 mm thick which can be removed by etching.

As shown in FIG. 3A, the temporary support has been coated on one side with an adhesion promotable composition 36 and an insulating layer 38 superimposed on the adhes composition. Suitable adhesion promotable compositions are well known in the art such as TECHNICOL TM 8001 from Beiersdorf AG. Other materials have been disclosed by Stahl et al. U.S. Pat. No. 3,625,758. Epoxy and polyimide prepregs and high temperature engineering thermo-plastics such as polysulfones, polyether-etherketone and polyetherimide are typical of suitable insulating compositions.

Figure 3B:
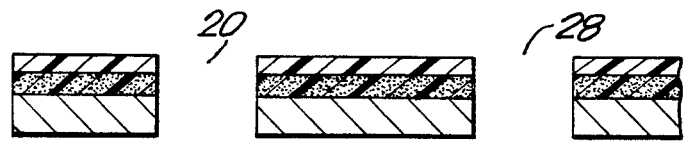

In the next step as shown in FIG. 3B holes 20 and 28 are formed through the temporary support, the adhesion promotable layer and the insulating layer. The holes are formed in a predetermined pattern corresponding to the locations where interlayer connections are desired. The holes may be formed on a numerically controlled drilling machine, or by any other convenient apparatus.

In an alternate procedure, only the holes corresponding to the interlayer connection between the scribed signal conductor layer and surface conductor lands are drilled through the temporary support. The holes for plated-through holes are drilled later after the temporary support is removed.

Figure 3C:

Following the formation of the holes, as shown in FIG. 3C, a wire scribing adhesive 26 is applied to cover the insulating composition and cover or tent over the holes. Wire scribing adhesives are well known in the art and have been described in European Patent No. 0,227,002 to Friedrich and U.S. Pat. Nos. 4,642,321 to Schonberg et al. and 4,544,801 to Rudik et al.

Figure 3D:
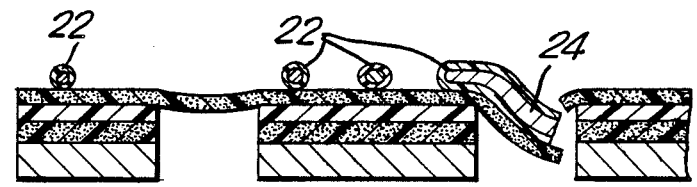

A conductive pattern is scribed into the wire scribing adhesive as shown in FIG. 3D. The scribed conductive filaments 22 form a signal conductor layer and where a filament passes over a hole a segment of the filament 24 is displaced from the plane of the signal conductor layer into the hole. When one or more filaments traverse another filament forming a crossover (not shown), the crossing filament is displaced in the opposite direction from the displacement of the segment displaced into the hole. The conductive filaments are typically insulated copper wire. The insulation is optional for metallic conductive filaments without crossovers, or for optical conductive filaments.

Figure 3E:
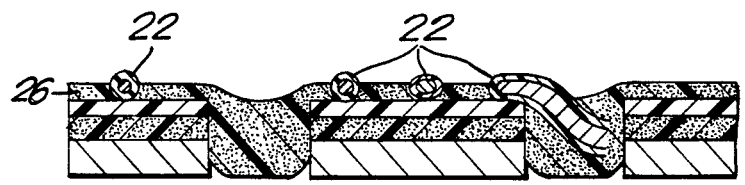

After the scribing process the filaments are further pressed down into the wire scribing adhesive layer by the application of heat and pressure. The pressure is applied to the scribed surface of the temporary support through a soft deformable material such as silicone rubber, and to the opposite side of the temporary support through a rigid material such as a steel caul plate. The steel caul plate may be coated with mold release or protected by release paper during the pressing operation. After the pressing as shown in FIG. 3E the filaments have been forced down in to the wire scribing adhesive layer, and the filament segment displaced from the signal conductor layer has been pressed even further down into the hole. During the pressing operation, some of the wire scribing adhesive or a mixture of the wire scribing adhesive and the adhesion promotable composition flows down into the hole(s). The holes are completely or partially filled depending on the high temperature rheologies of the adhesive and adhesion promotable composition used.

Figure 3F:
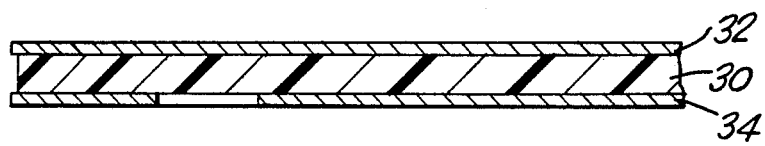

In FIG. 3F is shown a ground and voltage layer formed from a suitable metal-clad base material such as a copper-clad epoxy glass cloth laminate 0.8 mm (0.031 inch) thick. As shown in FIG. 3F, the base 30 is provided with a ground plane 32 and a voltage plane 34. A clearance hole 37 has been provided in the voltage plane by etching away a portion of the copper. Other clearance holes (not shown) are provided in the ground and voltage planes as required.

The base for the interconnection board provides the permanent support for the signal conductor layer(s) after the temporary support is removed. Suitable base materials include epoxy and polyimide laminates. Ground and voltage planes may be formed on the base material by well known printed wiring board manufacturing techniques, e.g., by etching clearance holes in the metal cladding of metal clad base material such as copper-clad or copper-invar-copper clad epoxy or polyimide laminates. The base material should have sufficient rigidity, strength and thickness to meet the requirements of the final interconnection board.

The scribed signal conductor layer mounted on a temporary support as shown in FIG. 3E is inverted and joined to the base shown in FIG. 3F. They may be joined by a conventional laminating technique using a layer of insulating material to bond them together to encapsulate the scribed conductors and to separate the scribed conductors from the ground plane. The signal conductor laminate, parallel to the ground plane, is in a microstrip configuration. The thickness of the insulating layer may be adjusted to provide transmission line characteristics such as controlled impedance for the signal conductor layer. The impedance depends on the thickness of the insulation between a ground or voltage plane and a signal conductor layer and on the dielectric constant of the insulation layer. The required thickness for different impedance and different dielectric constants are well known in the art. Boards also may be produced in stripline configuration by adding another ground or voltage plane and another insulating layer to the temporary support 40 shown in FIG. 3A between the insulating layer 38 and the wire scribing adhesive 36.

Figure 3G:
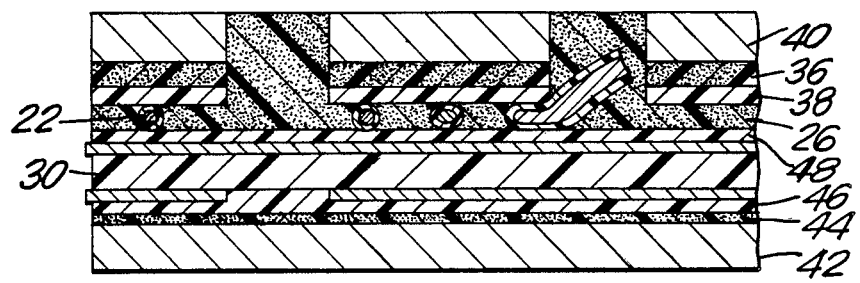

FIG. 3G shows in cross-section the result of the joining of the signal conductor layer on the temporary support to the base. Preferably a second temporary support 42 with an adhesion promotable layer 44 is laminated to the opposite side of the base 30 from the first temporary support 40 which carries the adhesion promotable layer 36, the insulating layer 38, the wire scribing adhesive 26, and the scribed conductor layer 22. The lamination may be carried out using epoxy prepreg to form insulating layers 46 and 48. During this laminating step the holes 20 and 28 are completely filled with the wire scribing adhesive or a combination of the adhesive with epoxy resin from the prepreg layer 48. The filament segment is encapsulated in a fixed position predetermined by the hole in the temporary support.

It is preferred to have the secondary temporary support to provide balanced construction and avoid warping or bowing from the laminating step. It is obvious that for a interconnection board with even higher signal conductor density, a second signal conductor layer could also be scribed onto the the second temporary support by the procedures described above.

In the next step, the temporary supports are removed. Temporary supports such as 0.25 mm (0.01 inch) thick aluminum sheets may be etched away in a sodium hydroxide solution. The resulting structure shown in FIG. 3H has flat surfaces 50 and 52 of adhesion promotable resins and knobs of wire scribing adhesive 54 protruding above the surface where holes had existed in the temporary support. The segments of filaments 24 displaced from the signal conductor layer 22 are embedded in preselected knobs.

Figure 3H:
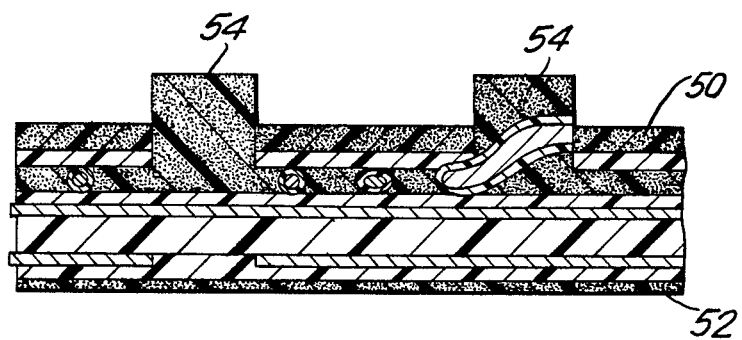
Figure 3I:
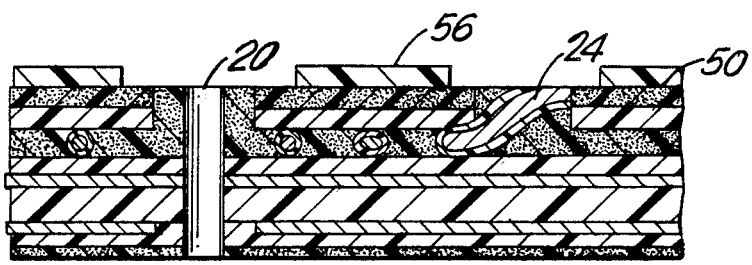

The knobs are cut or abraded off the surface 50 exposing the embedded filament segments and a hole 20 is drilled through the laminated structure. The resulting structure is shown in FIG. 3I. The portions of the other filaments not shown which are at the surface 50 are all substantially coplanar with one another. The exposed portion of the filament segment 24 has no insulation and is available for a surface conductor or for connection to a surface conductor layer.

Surface conductor patterns may be applied to the structure of FIG. 3I by fully additive techniques producing the interconnection board with the cross-section shown in FIG. 3. A permanent resist 56 is applied to the adhesion promotable surfaces 50 and 52. The surfaces are adhesion promoted and an electroless copper deposition produces the circuit conductor patterns 12 and the plated-through holes 20.

Similar surface conductor patterns may be produced by well known semi-additive techniques. In a semi-additive technique, a structure such as shown in FIG. 3I may be adhesion promoted and then metallized all over with a thin conductive film. A strippable resist would be applied leaving the surface conductive pattern exposed. The surface conductors may be formed by electroplating. After the conductors are plated, the resist and the thin conductive film underlying the resist are stripped away.

In an alternate semi-additive procedure a structure such as FIG. 3I is adhesion promoted, metallized and panel plated. After panel plating a etch resist image is applied and the board etched to form the surface conductive pattern.

In some embodiments of this invention, the exposed segments of the filaments would constitute the surface conductor layer. The exposed segments could connect to integrated circuit chips through tape automated bonding. If the segments are on a very fine pitch, the segments might be connected directly to integrated circuit chips. In other embodiments fiber optic filaments or combinations of optical filaments and wire filaments can be connected directly to optical or electro-optical components.

A wire scribed interconnection board according to this invention may be prepared using solid metal posts for connections to the voltage and ground planes instead of plated-through holes. Following the procedures described above, a temporary support is coated with an adhesion promotable composition and an insulation layer. Holes are formed through coatings and the temporary support in a predetermined pattern corresponding to the desired interlayer connections of the wire scribed circuit board. A layer of wire scribing adhesive is applied to the insulation layer and the conductive pattern of the desired signal conductor layer is wire scribed onto the adhesive The wire conductors are then pressed in a press as described above to force them into the adhesive and to force the segments which will constitute the interlayer connection into the holes in the temporary support.

The ground and voltage planes may be preformed from copper clad laminates such as 0.5 mm (0.020 inch) epoxy glass laminate clad on one side with copper foil 35 micrometer thick (1 ounce). Alternatively, the ground and voltage planes may be preformed from metal sheets such as 0.1 mm (3 ounce) copper foil or copper-invar-copper. The copper clad laminate or metal sheets are provided with holes to accommodate the solid metal posts, and at least one of the laminates or metal sheets is provided with clearance holes. The solid metal posts which will be used for connecting the ground and voltage planes to the surface conductor layer are inserted into the holes in the ground and voltage planes and a reliable connection is made between the metal cladding or metal sheets and the solid metal posts, for example, by welding or soldering.

Figure 4A:
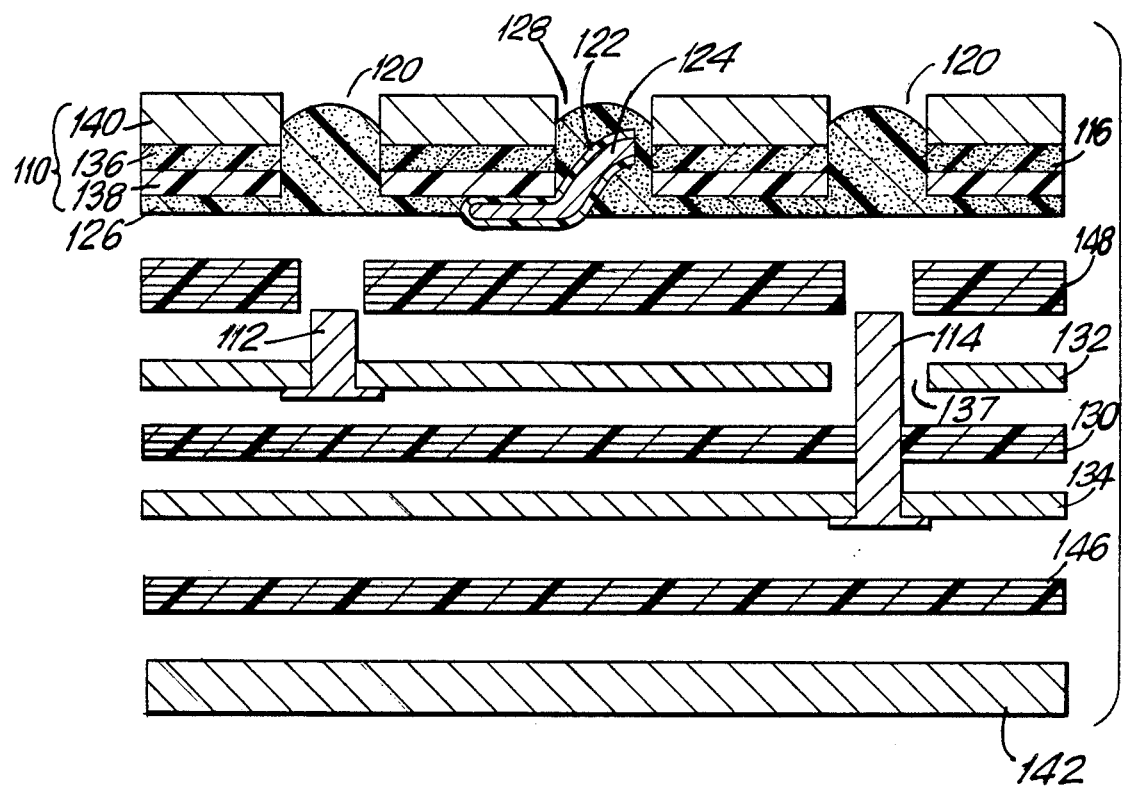
FIGS. 4A through 4D are cross-sectional views illustrating steps in preparing a portion of a wire scribed circuit board according to another embodiment of this invention.

The ground and voltage planes, the wire scribed signal conductor layer and intervening insulation layers are simultaneously laminated together. FIG. 4A shows an exploded view of the lay-up for lamination. In FIG. 4A, there is shown a unit 110 composed of the temporary support 140, on which is coated a layer of an adhesion promotable composition 136, and an insulation layer 138. Hole(s) 120 drilled in the temporary support for connections to the ground and voltage planes and hole(s) 128 drilled for connections to the signal conductor layer. A wire scribed signal conductor 122 is shown pressed into a wire scribing adhesive 126 and has a segment 124 which has been displaced from the signal conductor layer to subsequently form an interlayer connection.

Sheets of insulating material 148 are inserted in the lay-up to form the dielectric layer between the ground and voltage planes and the signal conductor layer. The composition of the insulating mdterial and the number of layers used will depend on impedance and service requirements of the interconnection board. Four to six plies of epoxy prepreg may be used for most applications. Other suitable sheet materials include polyimides and polyetherimides.

The ground plane 132 has a metal post 112 and a clearance hole 137. Sheets of insulating material 130 are positioned in the lay-up between the ground plane and the voltage plane 134. Epoxy prepreg is a typical insulating material. The voltage plane has a metal post 114 for an interlayer connection. Additional insulating material 146 and temporary backing plate 142 may be included in the lay-up to prevent warp after the laminating step.

Figure 4B:
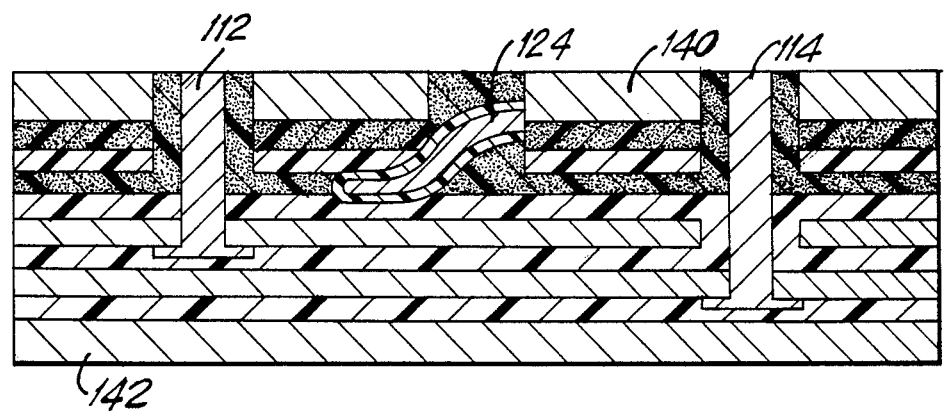

FIG. 4B shows the laminated structure.

Figure 4C:
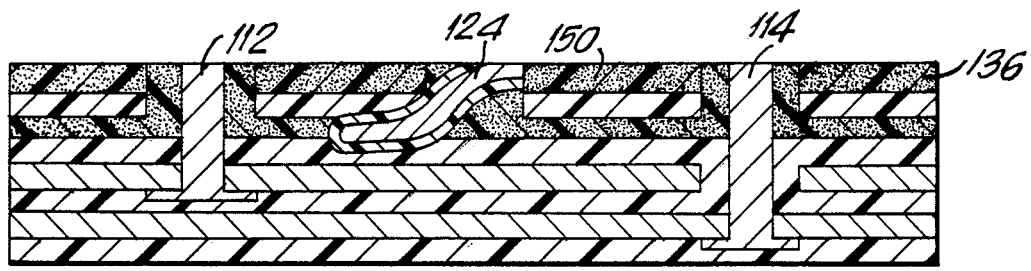

In FIG. 4C the structure is shown after the temporary support and temporary backing are stripped away. The metal posts 112 and 114 are shown cut down and the adhesion promotable layer 136 is cut or abraded down to expose the segment of the conductive filament 124 and to create a level, adhesion promotable surface 150.

Figure 4D:
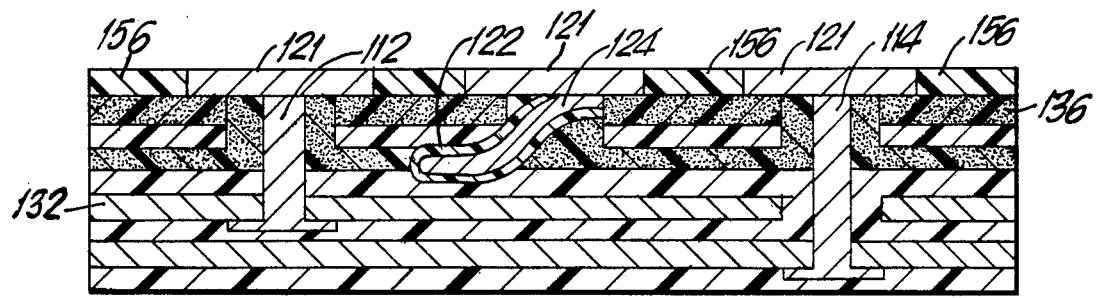

A finished part is shown in FIG. 4D. A plating resist image 156 is applied to the adhesion promotable surface to outline the surface conductive pattern. In FIG. 4D, the interconnection board is shown with a plated surface conductive pattern 121 on the adhesion promotable layer 136. The surface conductive pattern makes connections to the ground plane 132 through metal post 112, to the signal conductor layer 122 through the displaced conductor segment 124, and to the voltage plane through metal post 114.

Scribed interconnection boards may be prepared in a similar manner using eyelet or pins as interlayer connections between the surface conductive pattern and the ground and voltage planes. Pin may be inserted into the ground and voltage planes by well known techniques to form gas tight connections.

In scribing on a temporary support according to the procedures of this invention described above, the conductor segments which will interconnect the signal conductor layer to the surface conductive pattern are displaced into holes or depressions in the temporary support. In such cases, when two or more wires intersect at the same grid location and cross over one another, at the crossover the crossing wires are moved one or more wire diameters in a direction away from the temporary support opposite the direction from the displaced conductor segments. When the signal conductor layer has been laminated to the base material and the temporary support removed, the surface of laminated structure is cut or abraded to expose a portion of the displaced conductor segment as shown in FIGS. 3H and 3I. Because the conductor segments are displaced in a direction opposite from a crossover, there is no possibility of cutting into the top wire of a crossover and accidentally creating a short circuit from a crossover to the surface conductive pattern.

It will be obvious to those skilled in the art that the procedures of this invention can also be used by scribing a signal conductor layer onto coatings applied over the base material instead of coatings applied to a temporary support. Segments of the signal conductor which are to form interlayer connections to the surface conductive pattern would be displaced out of the signal conductor layer by moving the end of the segment at least one or preferably three or more conductive filament diameters above the crossovers in the signal conductor layer. This may be accomplished by scribing over bumps formed on or affixed to the base, in a predetermined pattern corresponding to the desired interlayer connections, or by modifications to the wire scribing head. Layers of insulating material and an adhesion promotable composition can then be applied over the signal conductor layer by curtain coating, casting, or other methods to encapsulate in fixed positions the displaced conductor segments which are to form interlayer connections. Then the ends of the displaced segments can be exposed and connections made in a manner similar to those described above. However, care must be taken to avoid exposing crossovers when exposing the displaced segments for connection.

What is claimed is:

1. An article for interconnecting electronic, optical and electro-optical devices comprising:
    a. a base;
    b. at least one internal conductor layer disposed within said article and formed by a plurality of conductive filiaments fixed in an adhesive layer in a first predetermined pattern, said internal conductor layer being adhered to a surface of said base;
    c. a plurality of said conductive filaments having segments displaced and extending from said internal conductor layer to a surface of said article for connecting the internal conductor layer to a conductor layer on the surface of said article;
    d. said conductor layer on the surface of said article including a plurality of conductors in a second predetermined pattern corresponding to terminals of the devices, said segments which are located at or in the vicinity of the surface of the article forming a part of the second predetermined pattern and providing interfaces for connecting to said devices; and
    e. an encapsulating coating which maintains the positional stability of the filaments and filament segments in said internal conductor layer and in said conductor layer on the surface of said article in said first and second predetermined patterns.

2. The article of claim 1 wherein the base includes a layer selected from the group consisting of a ground layer a voltage layer and both the ground and voltage layer.

3. The article of claim 2 wherein the conductor layer on the surface of said article also includes one or more conductors connected to a layer selected from the group consisting of the ground layer the voltage layer and both the ground and voltage layer.

4. The article of claim 3 wherein a plated through hole is used to connect the surface conductor layer to a layer selected from the group consisting of the ground layer the voltage layer and both the ground and voltage layer.

5. The article of claim 3 wherein a metallic post is used to connect the surface conductor layer to a layer selected from the group consisting of the ground layer the voltage layer and both the ground and voltage layer.

6. The article of claim 1 wherein said segments at the surface of the article are substantially coplanar relative to one another.

7. The article of claim 1 wherein the conductor layer on the surface of said article comprises portions of the filament segments.

8. The article of claim 1 wherein the conductor layer on the surface of said article comprises portions of the filament segments surrounded by continguousj surface conductor features joined to the filament segments.

9. An article for interconnecting electronic, optical and electro-optical devices comprising:
  a. a base having ground and voltage planes thereon;
  b. at least one internal conductor layer disposed within said article and formed by a plurality of conductive filaments fixed in an adhesive layer in a first predetermined pattern, said internal conductor layer being adhered to a surface of said base;
  c. a surface conductor layer suitable for mounting the devices thereon, selected portions of said surface conductor layer being connected to the internal conductor layer by segments of the conductive filaments displaced and extending from said internal conductor layer to the surface conductor layer, other portions of said surface conductor layer bieng connected to the ground and voltage planes; and
  d. an encapsulating coating which maintains the positional stability of the filaments and filament segments in said internal conductor layer and in said surface conductor layer in said first and second predetermined patterns.

10. The article of claim 9 wherein the surface pattern is connected to at least one of the planes by metallic posts.

11. The article of claim 9 wherein the surface pattern is connected to at least one of the planes by plated through holes.

12. In an electronic interconnection board on an insulating base wherein the conductive pattern comprises an internal wire scribed circuit conductor layer, a surface conductor layer and at least one interlayer connection between the internal wire scribed conductor layer, and the surface conductor layer, said surface conductor layer and said internal wire scribed conductor layer being located on one side of said insulating base, the improvement comprising: the interlayer connection comprising a segment of a wire scribed conductor form the wire scribed circuit conductor layer, said interlayer connection also being on the same side of the base as said surface conductor layer and said internal wire scribed conductor layer.

13. In a method for the manufacture of a scribed, conductive filament, interconnection board on an insulating base wherein the board is formed to have a conductive pattern comprising an internal wire scribed conductor layer and a surface conductor layer, said internal wire scribed conductor layer and said surface conductor layer being located on one side of said insulating base, the improvement comprising:
  forming on the same side of said insulating base as said internal wire scribed conductor layer and said surface conductor layer are located at least one interlayer connection between the internal scribed conductor layer and the surface of the board by displacing at least one segment of a filament from the internal scribed conductor layer to the vicinity of the surface to terminate to and form part of or connect with the surface conductive layer.

14. The method of claim 13, the improvement further comprisingj encapsulating the scribed conductors and the segment(s) so as to maintain the conductors and the segment(s) in predetermined positions on the board.

15. The method of claim 13 wherein the interconnection board further includes a plane selected from the group consisting of a ground plane, a voltage plane and both a ground plane and a voltage plane, and the improvement further comprising forming at least one interlayer ocnnection between the surfacae conductor layer and at least one of the planes by a plated-through hole.

16. The method of claim 13 wherein the interconnection board further includes a plane selected form the group consisting of a ground plane, a voltage plane and both a ground plane and a voltage plane, and the improvement further comprising forming at least one interlayer connection between the surface conductor layer and at least one of the planes by a metal post.

17. A process for the manufacture of a scribed, conductive filament, interconnection board said interconnection board having at least one scribed, conductor layer and at least one surface conductor layer and having interlayer connections in a predetermined pattern between the layers, the process comprising:
  providing a base capable of acting as a support structure for the interconnection board;
  providing a temporary support having an insulating layer thereon;
  forming holes or depressions in the temproary support in a pattern corresponding to the interlayer connections;
  scribing a scribed, conductor layer on the temproary support and the interlayer connections into holes or the depressions in the temproary support;
  permanently fixing the position of the scribed conductor layer and the interlayer connections by laminatingj and joiningj the scribed conductor layer and interlayer connections to the base thereby forming a laminated board;
  removing the temproarry support, and
  forming a surface conductor layer on the surface of the laminated board, the surface conductor layer being formed so as to provide an electrical contact to the interlayer connections.

18. A process according to claim 17 wherein the scribed conductor layer and the interlayer connections are permanently fixed and joined to the base by means of an insulating resin selected from the group consisting of epoxy, polyimide resins and polyetherimide.

19. The method of claim 17 wherein the interconnection board further includes a plane selected from the group consisting of a ground plane voltage plane, and both a ground plane and a voltage plane, and the improvement further comprising forming the plane(s) on the base before joining the scribed conductor layer to the base, and forming at least one interlayer connection between the surface conductor layer and at least one of the planes by means of a plated-through hole.

20. The method of claim 17 wherein the interconnection board further includes a plane selected form the group consisting of a ground plane a voltage plane, and both a ground plane and a voltage plane, and the improvement further comprising forming the plane(s) on the base before joining the scribed conductor layer to the base, and forming at least one interlayer connection between the surface conductor layer and at least one of the plane(s) by means of a metal post.

* * * * *